United States Patent
Tsukude et al.

[11] Patent Number: 5,848,012
[45] Date of Patent: Dec. 8, 1998

[54] SEMICONDUCTOR MEMORY DEVICE HAVING HIERARCHICAL BIT LINE STRUCTURE EMPLOYING IMPROVED BIT LINE PRECHARGING SYSTEM

[75] Inventors: Masaki Tsukude; Takahiro Tsuruda, both of Hyogo, Japan

[73] Assignee: Mitsubishi Denki Kabushiki Kaisha, Tokyo, Japan

[21] Appl. No.: 841,139

[22] Filed: Apr. 24, 1997

Related U.S. Application Data

[62] Division of Ser. No. 517,029, Aug. 18, 1995, Pat. No. 5,652,726.

[30] Foreign Application Priority Data

Dec. 15, 1994 [JP] Japan .................................. 6-312064

[51] Int. Cl.⁶ ............................... G11C 5/02; G11C 5/06
[52] U.S. Cl. ...................... 365/230.03; 365/203; 365/202
[58] Field of Search ......................... 365/230.01, 230.03, 365/149, 203, 202

[56] References Cited

U.S. PATENT DOCUMENTS

| | | |
|---|---|---|
| 5,291,432 | 3/1994 | Furutani . |
| 5,291,450 | 3/1994 | Fujwara et al. . |
| 5,436,870 | 7/1995 | Sato et al. . |
| 5,495,440 | 2/1996 | Asakura .................................. 365/149 |
| 5,610,871 | 3/1997 | Hidaka ............................... 365/230.03 |
| 5,625,586 | 4/1997 | Yamasaki et al. ....................... 365/104 |
| 5,652,726 | 7/1997 | Tsukude et al. ......................... 365/203 |
| 5,682,343 | 10/1997 | Tomishima et al. ..................... 365/63 |

FOREIGN PATENT DOCUMENTS 60-234296 11/1985 Japan .
63-228496 9/1988 Japan .
1189096 7/1989 Japan .
5250875 9/1993 Japan .

OTHER PUBLICATIONS

NAND–Structured Cell Technologies for 256Mb DRAMs, T Yamada et al., Technical Report of IEICE, SDM94–18, ICD94–29 (1994–05) vol. 94, No. 72, pp. 13–18.
NAND–Structured Cell Technologies for Low Cost 256Mb DRAMs, T Hamamoto et al., IEDM 93 Technical Digest, pp. 643–646.

*Primary Examiner*—Viet Q. Nguyen
*Attorney, Agent, or Firm*—McDermott, Will & Emery

[57] ABSTRACT

A semiconductor memory device comprises a main bit line pair, a plurality of subbit line pairs, a plurality of selection transistor pairs, a plurality of word lines, a plurality of memory cells, and a plurality of first precharging circuits. The subbit line pairs are provided in correspondence to the main bit line pair. One and other subbit lines of the subbit line pairs are arranged in straight lines along the main bit line pair. The selection transistors are provided in correspondence to the subbit line pairs. Each of the selection transistor pairs is connected between the main bit line pair and the corresponding subbit line pair, and turned on in response to a prescribed selection signal. The word lines are arranged to intersect with one and the other subbit lines of the subbit line pairs. The memory cells are provided in correspondence to intersection points between one and the other subbit lines of the subbit line pairs and the word lines. Each of the memory cells is connected to the corresponding subbit line and the corresponding word line. The first precharging circuits are provided in correspondence to the subbit line pairs. Each of the first precharging circuits directly precharges the corresponding subbit line pair at the prescribed precharging potential.

6 Claims, 16 Drawing Sheets

SEMICONDUCTOR MEMORY DEVICE HAVING HIERARCHICAL BIT LINE STRUCTURE EMPLOYING IMPROVED BIT LINE PRECHARGING SYSTEM

This application is a division of Application Ser. No. 08/517,029 filed Aug. 18, 1995, now U.S. Pat. No. 5,652,726.

CROSS-REFERENCE TO RELATED APPLICATIONS

This application is related to copending application Ser. No. 08/226,485, filed Apr. 12, 1994, commonly assigned with the present invention.

BACKGROUND OF THE INVENTION

1. Field of the Invention

The present invention relates to a semiconductor memory device, and more particularly, it relates to an improvement of a bit line precharging circuit in a dynamic random access memory (DRAM) having a hierarchical bit line structure.

2. Description of the Background Art

In general, a DRAM having the so-called hierarchical bit line structure has been proposed for the purpose of implementing a high storage capacity with a small chip area. In this DRAM, a plurality of subbit line pairs are provided in correspondence to one main bit line pair, and each subbit line pair is connected to the main bit line pair through two selection transistors. For example, Japanese Patent Laying-Open No. 60-234296 (1985) discloses a technique of connecting only subbit line pairs which are provided in a selected block to a main bit line pair.

Also in the DRAM having such a hierarchical bit line structure, it is necessary to precharge the main bit line pair and the subbit line pairs to a prescribed precharging potential (intermediate potential Vcc/2) in advance of data reading. If only one precharging circuit is simply provided in correspondence to one main bit line pair, however, a considerable time is required for the potentials of the subbit line pairs to reach the prescribed precharging potential, since the precharging potential is supplied to the subbit line pairs through the main bit line pair and the selection transistors. Further, subbit line pairs provided in a non-selected block are cut off from the main bit line pair to be brought into electrically floating states, and hence the potentials thereof are reduced in a non-selected period even if the subbit line pairs are precharged to the prescribed precharging potential. Therefore, the main bit line pair and the subbit line pairs must be precharged every time the latter are connected to the former. The aforementioned Japanese Patent Laying-Open No. 60-234296 neither discloses nor suggests a method of precharging the main bit line pair and the subbit line pairs.

SUMMARY OF THE INVENTION

Accordingly, a first object of the present invention is to provide a semiconductor memory device of a hierarchical bit line structure having a high read rate.

Another object of the present invention is to provide a semiconductor memory device of a hierarchical bit line structure which can precharge subbit line pairs at a high speed.

Still another object of the present invention is to provide a semiconductor memory device which can maintain potentials of subbit line pairs at a prescribed precharging potential up to an instance immediately before data reading.

A further object of the present invention is to provide a semiconductor memory device which can precharge subbit line pairs at a high speed without increasing the chip area.

A semiconductor memory device according to a first aspect of the present invention comprises a main bit line pair, a plurality of subbit line pairs, a plurality of selection transistor pairs, a plurality of word lines, a plurality of memory cells, and a plurality of first precharging circuits. The plurality of subbit line pairs are provided in correspondence to the main bit line pair. First and second subbit lines of the plurality of subbit line pairs are arranged in straight lines along the main bit line pair. The plurality of selection transistor pairs are provided in correspondence to the plurality of subbit line pairs. Each of the plurality of selection transistor pairs is provided between the main bit line pair and the corresponding subbit line pair, and enters a conducting state in response to a prescribed selection signal. The plurality of word lines are arranged to intersect with the first and second subbit lines of the plurality of subbit line pairs. The plurality of memory cells are provided in correspondence to intersection points between the first and second subbit lines of the plurality of subbit line pairs and the plurality of word lines. Each of the plurality of memory cells is connected to the corresponding subbit line and the corresponding word line. The plurality of first precharging circuits are provided in correspondence to the plurality of subbit line pairs. Each of the plurality of first precharging circuits directly precharges the corresponding subbit line pair at a prescribed precharging potential.

A semiconductor device according to a second aspect of the present invention comprises a semiconductor substrate, a plurality of memory cell blocks, a plurality of main bit line pairs, and a precharging potential generation circuit. The plurality of memory cell blocks are arranged on the semiconductor substrate in a row direction. The plurality of main bit line pairs are arranged on the semiconductor substrate longitudinally across the plurality of memory cell blocks. The precharging potential generation circuit generates a prescribed precharging potential. Each of the plurality of memory cell blocks includes a plurality of subbit line pairs, a plurality of first selection transistor pairs, a plurality of word lines, a plurality of memory cells, a first precharging potential supply line, a first precharging control line, a second precharging control line, a plurality of first precharging transistors, and a plurality of second precharging transistors. The plurality of subbit line pairs are provided in correspondence to the plurality of main bit line pairs. First and second subbit lines of the plurality of subbit line pairs in each of the plurality of memory cell blocks are arranged in straight lines along the corresponding main bit line pairs respectively. The plurality of selection transistor pairs are provided in correspondence to the plurality of subbit line pairs, and enter conducting states in response to a prescribed block selection signal. Each of the plurality of selection transistor pairs is connected between the corresponding main bit line pair and the corresponding subbit line pair. The plurality of word lines are arranged to intersect with the first and second subbit lines of the plurality of subbit line pairs. The plurality of memory cells are provided in correspondence to intersection points between the first and second subbit lines of the plurality of subbit line pairs and the plurality of word lines. Each of the plurality of memory cells is connected to the corresponding subbit line and the corresponding word line. The first precharging potential supply line is arranged between the first and second subbit lines of the plurality of subbit line pairs along the plurality of word lines. The first precharging potential supply line is supplied with the precharging potential from the precharging potential generation circuit. The first precharging control line is arranged between the first precharging potential supply line and the word lines which are arranged on one side thereof along the plurality of word lines. The second precharging control line is arranged between the first precharging potential supply line and the word lines which are arranged on another side thereof along the plurality of word lines. The plurality of first precharging transistors are provided in correspondence to the first subbit lines of the plurality of subbit line pairs. Each of the plurality of precharging transistors is connected between the corresponding first subbit line and the first precharging potential supply circuit, and has a control electrode which is connected to the first precharging control line. The plurality of second precharging transistors are provided in correspondence to the second subbit lines of the plurality of subbit line pairs. Each of the plurality of second precharging transistors is connected between the corresponding second subbit line and the first precharging potential supply line, and has a control electrode which is connected to the second precharging control line.

In the semiconductor memory device according to the first aspect of the present invention, each first precharging circuit is provided in correspondence to each of the subbit line pairs having the so-called open bit line structure, whereby each subbit line pair is directly precharged. Therefore, the potentials of the subbit line pairs reliably reach the prescribed precharging level at a high speed.

In the semiconductor memory device according to the second aspect of the present invention, on the other hand, the precharging potential from the precharging potential generation circuit is supplied to the first precharging potential supply line, and further supplied to the first and second subbit lines through the first and second precharging transistors respectively. Thus, the subbit line pairs are directly precharged, whereby the potentials thereof reliably reach the prescribed precharging level at a high speed. Further, the first and second precharging control lines are arranged between the first and second subbit lines in the same direction as the word lines, whereby the chip area is hardly increased by addition of the first and second precharging control lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
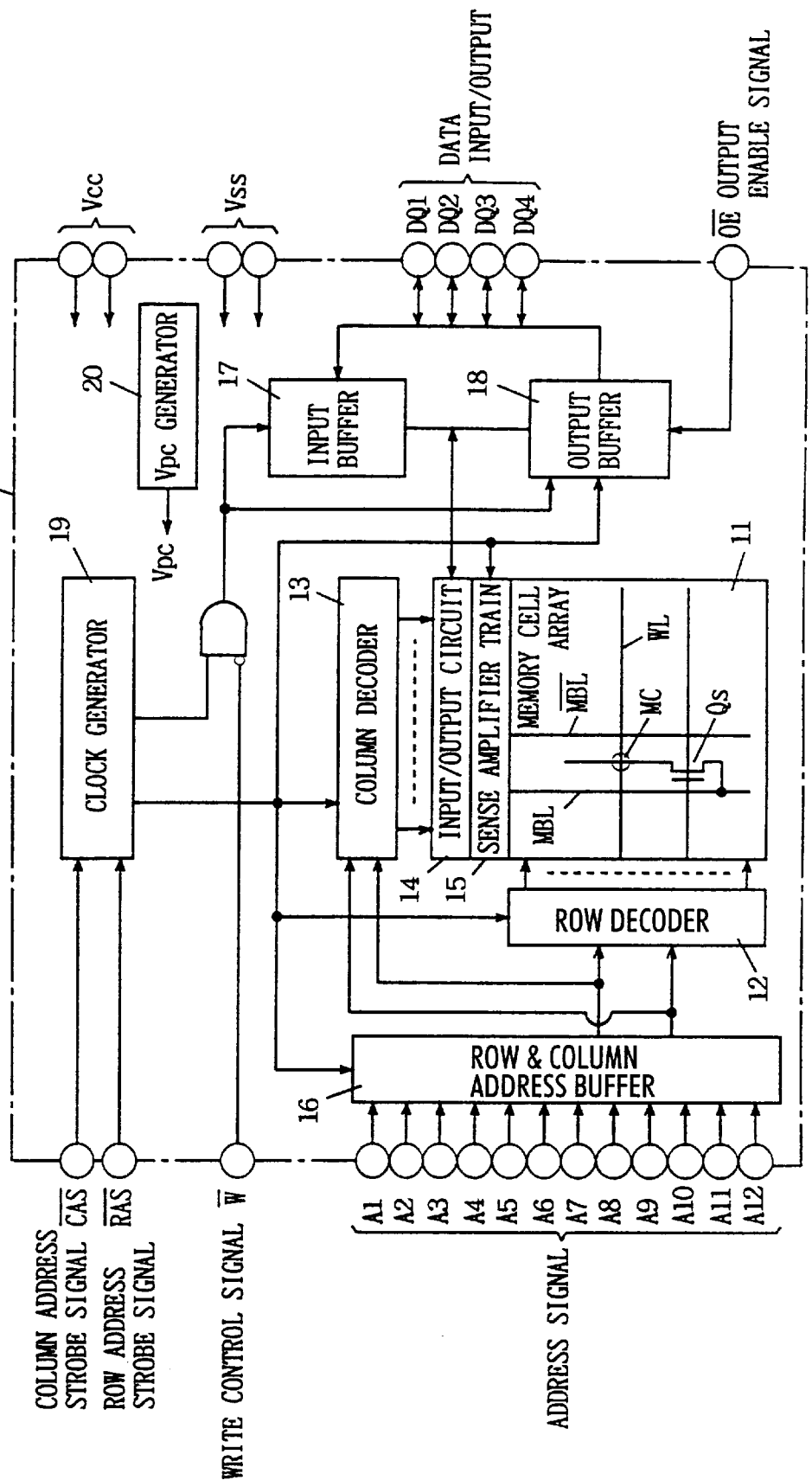
FIG. 1 is a block diagram showing the overall structure of a DRAM according to an embodiment 1 of the present invention.

Embodiments of the present invention are now described in detail with reference to the drawings. Referring to the figures, reference numerals which are identical to each other denote the same or corresponding portions.

Embodiment 1

FIG. 1 is a block diagram showing the overall structure of a DRAM according to an embodiment 1 of the present invention. Referring to FIG. 1, this DRAM is formed on a single semiconductor substrate 10. The DRAM comprises a memory cell array 11 formed by a plurality of memory cells MC which are arranged in the form of a matrix consisting of rows and columns, a row decoder 12 for selecting one row of the memory cell array 11, a column decoder 13 for selecting one column of the memory cell array 11, a sense amplifier train 15 for amplifying data from the memory cell array 11, and an input/output circuit 14 for inputting/outputting data of the column selected by the column decoder 13.

This DRAM further comprises a row and column address buffer 16 for supplying external address signals A1 to A12 to the row decoder 12 and the column decoder 13 as row address signals and column address signals respectively, an input buffer 17 for supplying external input data DQ1 to DQ4 to the input/output circuit 14, an output buffer 18 for supplying the data from the input/output circuit 14 to the exterior as output data TQ1 to TQ4, a clock generation circuit 19 for generating various control signals in response to row and column address strobe signals /RAS and /CAS, and a precharging potential generator 20 for generating a prescribed precharging potential Vcp.

Figure 2:
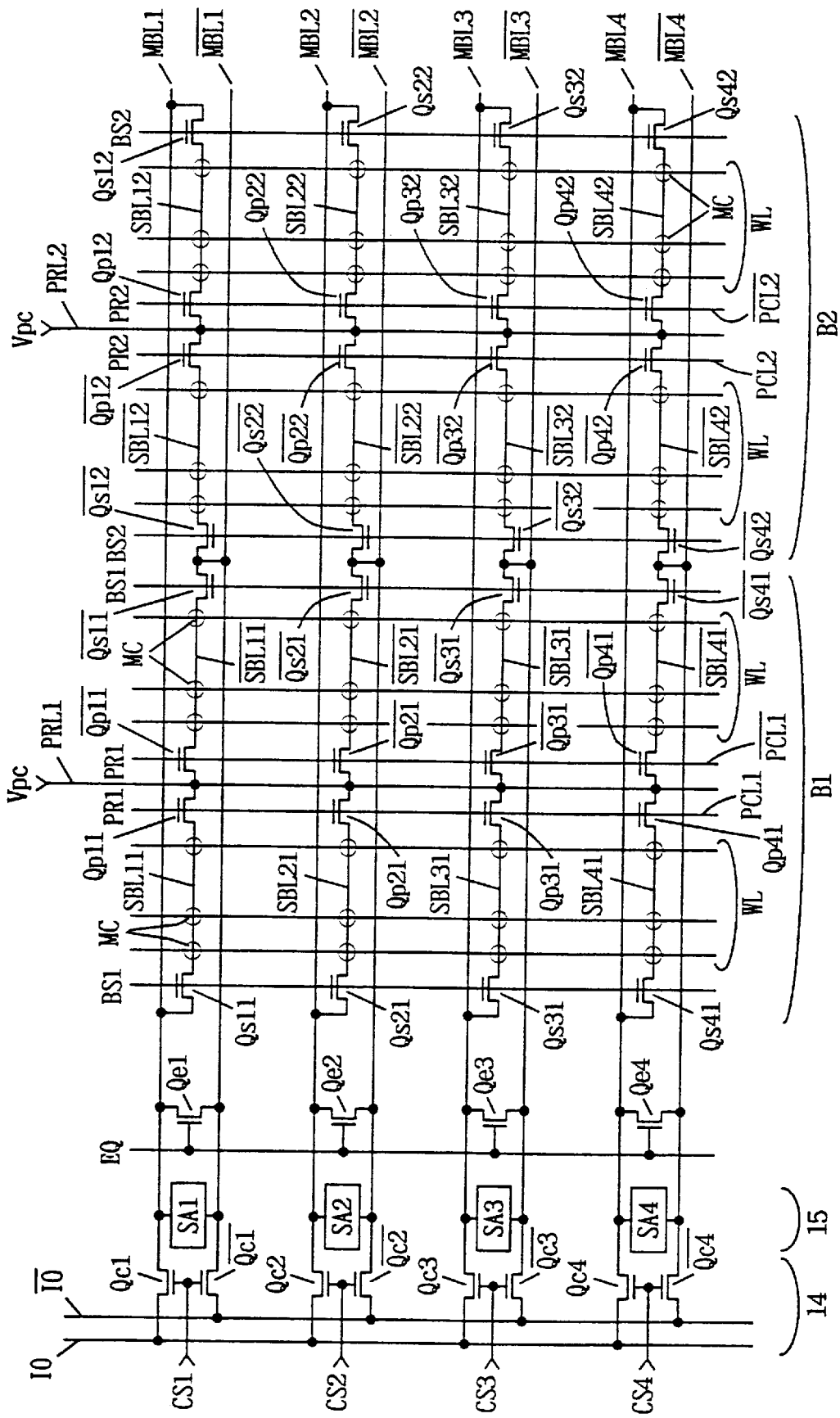
FIG. 2 is a circuit diagram showing a partial structure of a memory cell array shown in FIG. 1.

FIG. 2 is a circuit diagram showing four columns of the memory cell array 11 shown in FIG. 1. Referring to FIG. 2, the memory cell array 11 comprises a plurality of main bit line pairs MBL1 and /MBL1 to MBL4 and /MBL4, and equalizing transistors Qe1 to Qe4 which are connected in correspondence to the main bit line pairs MBL1 and /MBL1 to MBL4 and /MBL4 respectively. Further, sense amplifiers SA1 to SA4 are connected in correspondence to the main bit line pairs MBL1 and /MBL1 to MBL4 and /MBL4 respectively. The main bit line pairs MBL1 and /MBL1 to MBL4 and /MBL4 are connected to an input/output line pair IO and /IO through column selection gates consisting of pairs of N-channel MOS transistors Qc1 and /Qc1 to Qc4 and /Qc4 respectively. The column selection gate consisting of the transistors Qc1 and /Qc1 enters a conducting state in response to a column selection signal CS1 from the column decoder 13, whereby the main bit lines MBL1 and /MBL1 are connected to the input/output lines IO and /IO respectively. The column selection gate consisting of the transistors Qc2 and /Qc2 enters a conducting state in response to a column selection signal CS2, whereby the main bit lines MBL2 and /MBL2 are connected to the input/output lines IO and /IO respectively. The column selection gate consisting of the transistors Qc3 and /Qc3 enters a conducting state in response to a column selection signal CS3, whereby the main bit lines MBL3 and /MBL3 are connected to the input/output lines IO and /IO respectively. The column selection gate consisting of the transistors Qc4 and /Qc4 enters a conducting state in response to a column selection signal CS4, whereby the main bit lines MBL4 and /MBL4 are connected to the input/output lines IO and /IO respectively. The sense amplifiers SA1 to SA4 are included in the sense amplifier train 15 shown in FIG. 1, while the transistors Qc1 and /Qc1 to Qc4 and /Qc4 and the input/output line pair IO and /IO are included in the input/output circuit 14 shown in FIG. 1.

The memory cell array 11 comprises a plurality of memory cell blocks which are arranged in the row direction. FIG. 2 representatively shows only blocks B1 and B2. In the block B1, subbit lines SBL11 and /SBL11 are arranged in correspondence to the main bit line pair MBL1 and /MBL1. These subbit lines SBL11 and /SBL11 are arranged in a straight line along the main bit line pair MBL1 and /MBL1. Therefore, the subbit line pair SBL11 and /SBL11 has the so-called open bit line structure. Similarly to the main bit line pair MBL1 and /MBL1, subbit line pairs SBL21 and /SBL21 to SBL41 and /SBL41 are arranged along the remaining main bit line pairs MBL2 and /MBL2 to MBL4 and /MBL4 respectively.

In the block B1, further, a selection transistor pair Qs11 and /Qs11 is arranged in correspondence to the subbit line pair SBL11 and /SBL11. The subbit line SBL11 is connected to the main bit line MBL1 through the transistor Qs11, while the subbit line /SBL11 is connected to the main bit line /MBL1 through the transistor /Qs11. Similarly to the subbit line pair SBL11 and /SBL11, selection transistor pairs Qs21 and /Qs21 to Qs41 and /Qs41 are arranged also in correspondence to the remaining subbit line pairs SBL21 and /SBL21 to SBL41 and /SBL41 respectively. All these transistors Qs11 to Qs41 and /Qs11 to /Qs41 enter conducting states in response to a single block selection signal BL1. Therefore, the block B1 is selected when the block selection signal BL1 is at a high logical level.

In the block B1, further, a plurality of word lines WL are arranged to intersect with the subbit lines SBL11 to SBL41, while a plurality of word lines WL are also arranged to intersect with the subbit lines /SBL11 to /SBL41. FIG. 2 representatively shows three word lines WL intersecting with the subbit lines SBL11 to SBL41, and three word lines WL intersecting with the subbit lines /SBL11 to /SBL41 respectively.

Figure 3:
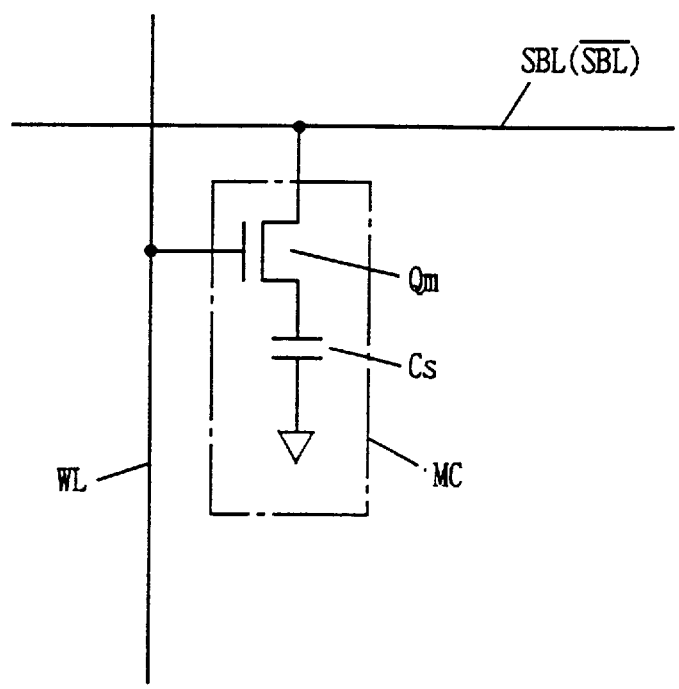
FIG. 3 is a circuit diagram showing the structure of one memory cell shown in FIG. 2.

A plurality of memory cells MC are arranged in correspondence to all intersection points between the subbit lines SBL11 to SBL41 and /SBL11 to /SBL41 and the word lines WL. FIG. 3 is a circuit diagram showing the structure of each memory cell MC shown in FIG. 2. Referring to FIG. 3, the memory cell MC comprises an access transistor Qm and a cell capacitor Cs. The access transistor Qm is connected between the corresponding subbit line SBL or /SBL and the cell capacitor Cs, and has a gate electrode which is connected to the corresponding word line WL. Therefore, the access transistor Qm enters a conducting state when the potential of the word line WL is increased, whereby charges flow out from the cell capacitor Cs to the subbit line SBL or /SBL through the access transistor Qm, or flow in the cell capacitor Cs from the subbit line SBL or /SBL through the access transistor Qm.

In the block B1, further, a precharging potential supply line PRL1 is arranged between the subbit lines SBL11 to SBL41 and /SBL11 to /SBL41 along the word lines WL. In addition, precharging transistors Qp11 to Qp41 and /Qp11 to /Qp41 are arranged in correspondence to the subbit lines SBL11 to SBL41 and /SBL11 to /SBL41 respectively, so that the subbit lines SBL11 to SBL41 and /SBL11 to /SBL41 are connected to the precharging potential supply line PRL1 in common through the precharging transistors Qp11 to Qp41 and /Qp11 to /Qp41 respectively.

Gate electrodes of the precharging transistors Qp11 to Qp41 are connected in common to a precharging control line PCL1 which is arranged on the left side of the precharging potential supply line PRL1 in FIG. 2. On the other hand, gate electrodes of the precharging transistors /Qp11 to /Qp41 are connected in common to a precharging control line /PCL1 which is arranged on the right side of the precharging potential supply line PRL1 in FIG. 2. Therefore, all precharging transistors Qp11 to Qp41 and /Qp11 to /Qp41 enter conducting states in response to a precharging signal PR1, whereby the precharging potential Vpc which is supplied from the precharging potential generator 20 shown in FIG. 1 to the precharging potential supply line PRL1 is supplied to all subbit lines SBL11 to SBL41 and /SBL11 to /SBL41. A potential (hereinafter referred to as "intermediate potential") Vcc/2 which is half a source potential Vcc is supplied as the precharging potential Vpc. Therefore, all subbit lines SBL11 to SBL41 and /SBL11 to /SBL41 are precharged at the intermediate potential Vcc/2.

The block B2 is structured substantially similarly to the block B1. In this block B2, subbit line pairs SBL12 and /SBL12 to SBL42 and /SBL42 are arranged in correspondence to the main bit line pairs MBL1 and /MBL1 to MBL4 and /MBL4 respectively. Further, selection transistor pairs Qs12 and /Qs12 to Qs42 and /Qs42 are arranged in correspondence to the subbit line pairs SBL12 and /SBL12 to SBL42 and /SBL42 respectively. In addition, a precharging potential supply line PRL2 is arranged between the subbit lines SBL12 to SBL42 and the subbit lines /SBL12 to /SBL42 along word lines WL. Further, precharging transistors Qp12 to Qp42 and /Qp12 to /Qp42 are arranged in correspondence to the subbit lines SBL12 to SBL42 and /SBL12 to /SBL42 respectively, so that the subbit lines SBL12 to SBL42 and /SBL12 to /SBL42 are connected to the precharging potential supply line PRL2 in common through the precharging transistors Qp12 to Qp42 and /Qp12 to /Qp42 respectively. When a block selection signal BS2 goes high, therefore, this block B2 is selected. When a precharging signal PR2 goes high, further, the precharging potential Vpc is supplied to all subbit lines SBL12 to SBL42 and /SBL12 to /SBL42.

A read operation of the aforementioned DRAM is now described with reference to a timing chart shown in FIG. 4. In a standby state, a high-level equalizing signal EQ is supplied to the gate electrodes of the equalizing transistors Qe1 to Qe4 as shown at (b) in FIG. 4, whereby the potentials of the main bit lines MBL1 to MBL4 are equalized with those of the main bit lines /MBL1 to /MBL4. In this case, the equalizing transistors Qe1 to Qe4 are brought into conducting states in such a state that the potentials of first ones of the main bit lines are at high levels and those of second ones of the main bit lines are at low levels, whereby all potentials of the main bit lines MBL1 to MBL4 and /MBL1 to /MBL4 are at the intermediate potential Vcc/2.

Figure 4:
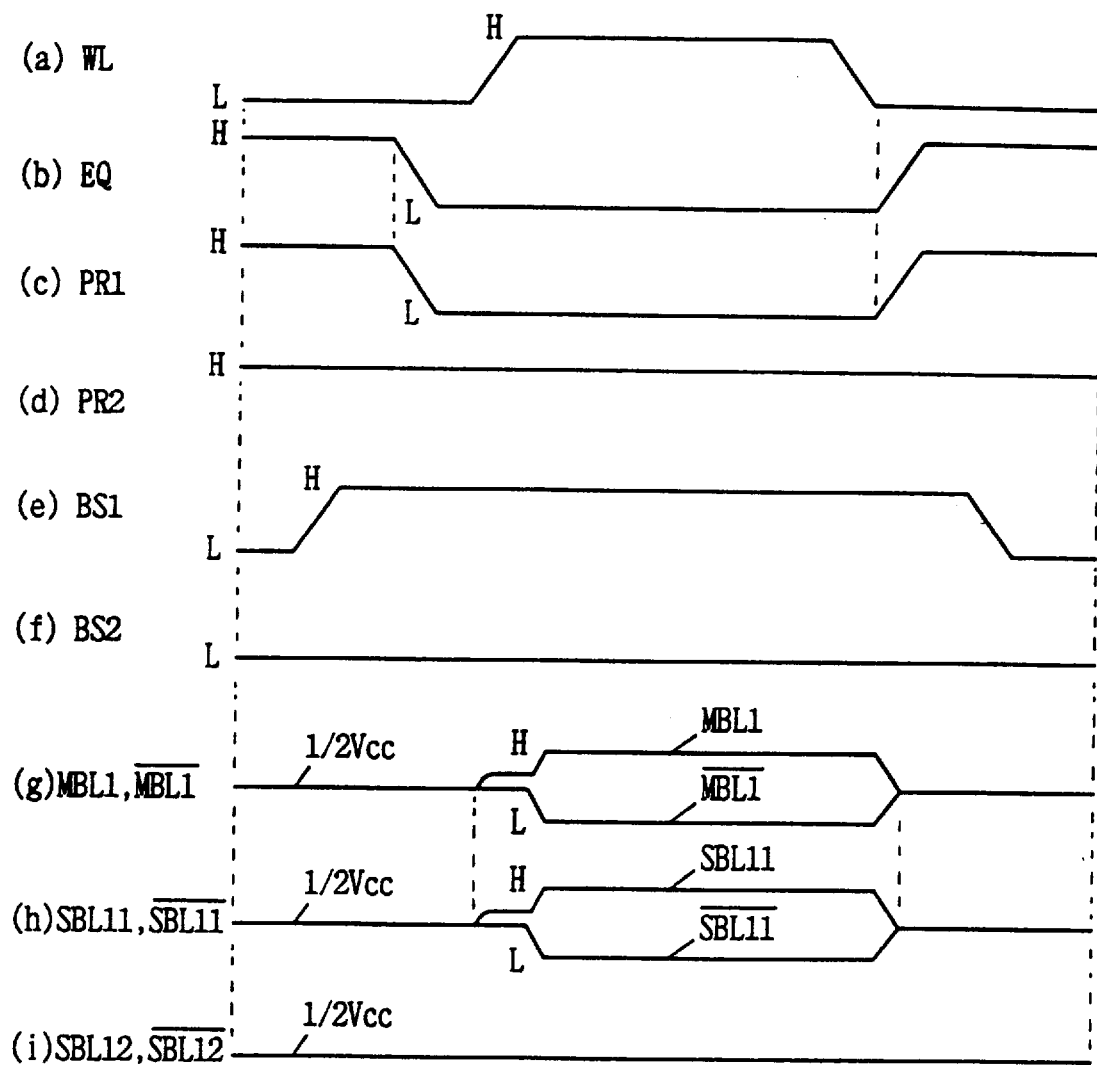
FIG. 4 is a timing chart showing a read operation of the DRAM shown in FIG. 2.

Further, all block selection signals are at low logical levels as shown at (e) and (f) in FIG. 4, whereby all memory cell blocks are in non-selected states. Therefore, all selection transistors Qs11 to Qs41 and /Qs11 to /Qs41 provided in the block B1, for example, are in non-conducting states. Further, all selection transistors Qs12 to Qs42 and /Qs12 to /Qs42 provided in the block B2 are also in non-conducting states.

In addition, all precharging signals are at high levels, as shown at (c) and (d) in FIG. 4. Therefore, all precharging transistors Qp11 to Qp41 and /Qp11 to /Qp41 provided in the block B1, for example, are in conducting states. Further, all precharging transistors Qp12 to Qp42 and /Qp12 to /Qp42 provided in the block B2 are also in conducting states. Therefore, the precharging potential Vpc which is supplied from the precharging potential generator 20 to the precharging potential supply line PRL1 is supplied to the subbit lines SBL11 to SBL41 and /SBL11 to /SBL41 through the precharging transistors Qp11 to Qp41 and /Qp11 to /Qp41 respectively. Since the intermediate potential Vcc/2 is supplied as the precharging potential Vpc, all subbit lines SBL11 to SBL41 and /SBL11 to /SBL41 are precharged at the intermediate potential Vcc/2. Further, the precharging potential Vpc which is supplied from the precharging potential generator 20 to the precharging potential supply line PRL2 is supplied to the subbit lines SBL12 to SBL42 and /SBL12 to /SBL42 through the precharging transistors Qp12 to Qp42 and /Qp12 to /Qp42 respectively. Therefore, all subbit lines SBL12 to SBL42 and /SBL12 to /SBL42 are also precharged at the intermediate potential Vcc/2.

Then, the block selection signal BS1 rises as shown at (e) in FIG. 4, whereby the selection transistors Qs11 to Qs41 and /Qs11 to /Qs41 enter conducting states, and the block B1 is selected. Thus, the subbit line pairs SBL11 and /SBL11 to SBL41 and /SBL41 are connected to the main bit line pairs MBL1 and /MBL1 to MBL4 and /MBL4 respectively. In this state, the precharging potential Vpc on the precharging potential supply line PRL1 is supplied to the main bit line MBL1 through the precharging transistor Qp11, the subbit line SBL11 and the selection transistor Qs11 as well as to the main bit line /MBL1 through the precharging transistor /Qp11, the subbit line /SBL11 and the selection transistor /Qs11, while the main bit lines MBL1 and /MBL1 are shorted to each other by the equalizing transistor Qe1, whereby the main bit line pair MBL1 and /MBL1 and the subbit line pair SBL11 and /SBL11 are correctly precharged at the intermediate potential Vcc/2. The remaining main bit line pairs MBL2 and /MBL2 to MBL4 and /MBL4 and subbit line pairs SBL21 and /SBL21 to SBL41 and /SBL41 are also correctly precharged at the intermediate potential Vcc/2, similarly to the main bit line pair MBL1 and /MBL1 and the subbit line pair SBL11 and /SBL11.

Then, both of the equalizing signal EQ and the precharging signal PR1 fall as shown at (b) and (c) in FIG. 4 respectively, whereby the equalizing transistors Qe1 to Qe4 and the precharging transistors Qp11 to Qp41 and /Qp11 to /Qp41 enter non-conducting states. Thus, the main bit line pairs MBL1 and /MBL1 to MBL4 and /MBL4 and the subbit line pairs SBL11 and /SBL11 to SBL41 and /SBL41 enter electrically floating states while maintaining the intermediate potential Vcc.

Then, the potential of one of the plurality of word lines WL provided in the block B1 is increased, as shown at (a) in FIG. 4. Thus, data are read from all memory cells MC which are connected to this word line WL to the corresponding subbit lines. When the potential of the word line WL intersecting with the subbit lines SBL11 to SBL41 is increased, for example, data are read from all memory cells MC which are connected with this word line WL to the subbit lines SBL11 to SBL41. If the memory cell MC which is arranged on the intersection point between the selected word line WL and the subbit line SBL11 stores high-level data, the potential of the subbit line SBL11 is slightly increased from the intermediate potential Vcc/2, as shown at (h) in FIG. 4. Following this, the potential of the main bit line MBL1 is also slightly increased from the intermediate potential Vcc/2, as shown at (g) in FIG. 4. Therefore, a potential difference caused which is caused in the subbit line pair SBL11 and /SBL11 is also caused in the main bit line pair MBL1 and /MBL1. Potential differences are also caused in the remaining bit line pairs MBL2 and /MBL2 to MBL4 and /MBL4, similarly to the main bit line pair MBL1 and /MBL1.

Then, the sense amplifiers SA1 to SA4 are activated, whereby the potential differences caused in the main bit line pairs MBL1 and /MBL1 to MBL4 and /MBL4 are amplified respectively. Thus, the potential of the main bit line MBL1 is increased to a high level while that of the main bit line /MBL1 is reduced to a low level as shown at (g) in FIG. 4, for example. Thus, the potential of the subbit line SBL11 is increased to a high level while that of the subbit line /SBL11 is reduced to a low level, as shown at (h) in FIG. 4. Also in the remaining main bit line pairs MBL2 and /MBL2 to MBL4 and /MBL4, the potentials of the first ones are increased to high levels, while those of the second ones are reduced to low levels.

Then, one column is selected in response to the column selection signals CS1 to CS4 which are supplied from the column decoder 13. When the column selection signal CS1 goes high, for example, the transistors Qc1 and /Qc1 enter conducting states, whereby the potentials of the main bit lines MBL1 and /MBL1 are transmitted to the input/output lines IO and /IO through the transistors Qc1 and /Qc1 respectively. The potentials of the input/output line pair IO and /IO are outputted to the exterior through the output buffer 18 as output data.

While the precharging for the subbit line pairs SBL11 and /SBL11 to SBL41 and /SBL41 is stopped in the word line activation period in the selected block B1, the precharging for the subbit line pairs SBL12 and /SBL12 to SBL42 and /SBL42 is continued in the non-selected block B2. Also when the precharging is thus continued in the non-selected block, the precharging potential Vpc is not transmitted to the main bit line pair since the selection transistors are in non-conducting states in this non-selected block. Whichever block is selected, equalization of the main bit line pair is necessarily stopped so that a potential difference can be caused in the main bit line pair.

According to the embodiment 1, as hereinabove described, the precharging potential is not indirectly but directly supplied to the subbit line pairs without through the main bit line pairs, whereby the subbit line pairs are precharged at a high speed. Thus, the data read time is reduced. Further, the precharging potential is supplied to the respective subbit line pairs independently of each other, whereby all subbit line pairs are reliably precharged at the prescribed potential. In addition, the subbit line pairs provided in the non-selected block are continuously precharged, whereby data can be immediately read from the memory cells upon selection of the block. Therefore, it is not necessary to precharge the subbit lines every time the block therefor is selected, whereby the data read time is further reduced. Further, no precharging transistors are connected between the main bit lines, whereby the chip area is reduced due to omission of occupied areas of such transistors.

Embodiment 2

Figure 5:
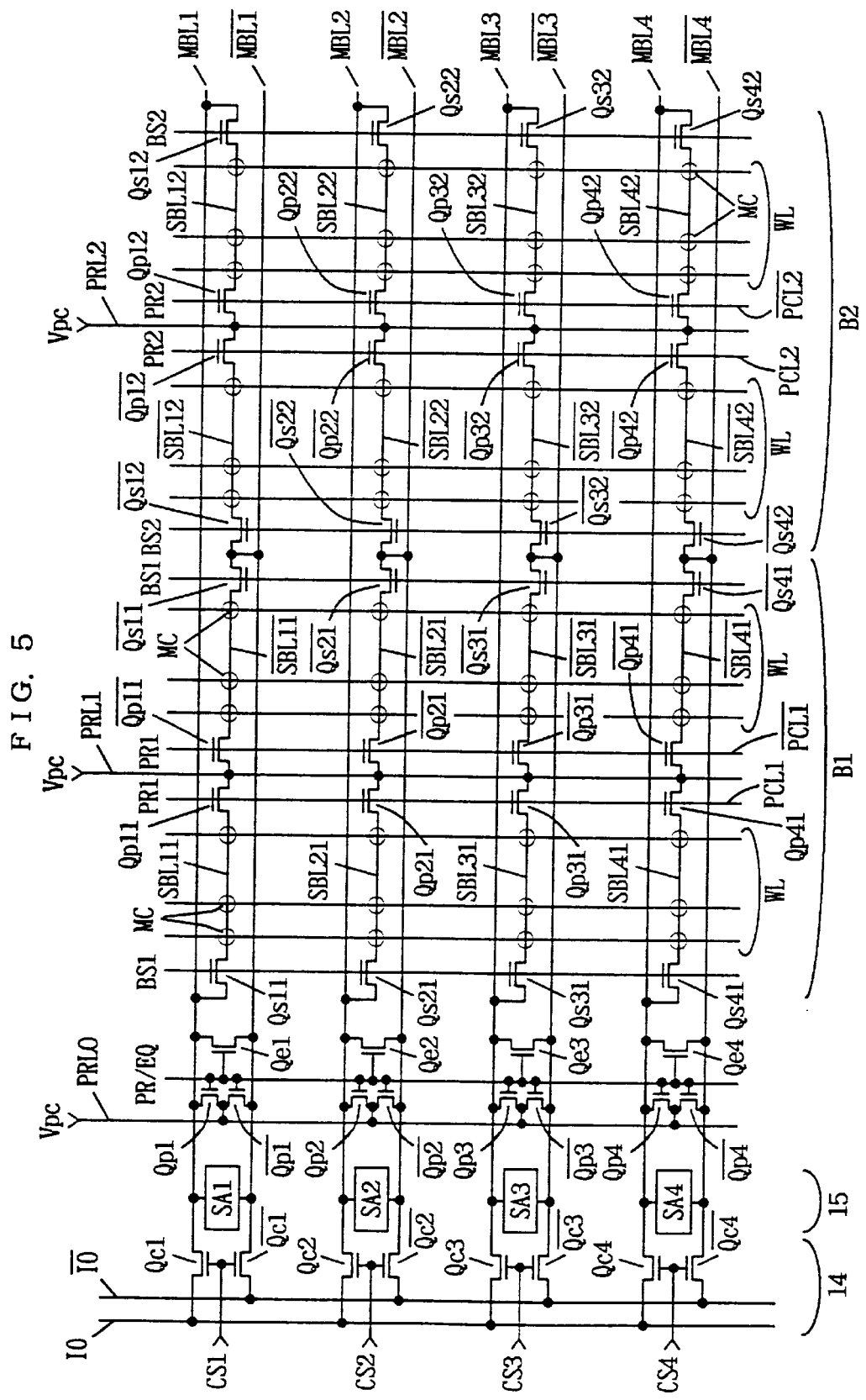
FIG. 5 is a circuit diagram showing a partial structure of a memory cell array in a DRAM according to an embodiment 2 of the present invention.

FIG. 5 is a circuit diagram showing a partial structure of a memory cell array provided in a DRAM according to an embodiment 2 of the present invention. Referring to FIG. 5, the embodiment 2 is provided with a circuit for directly precharging main bit line pairs, dissimilarly to the structure shown in FIG. 2. Namely, an N-channel MOS transistor Qp1 is connected between a main bit line MBL1 and a precharging potential supply line PRL0, while an N-channel MOS transistor /Qp1 is connected between a main bit line /MBL1 and the precharging potential supply line PRL0. Gate electrodes of these precharging transistors Qp1 and /Qp1 are supplied with a signal identical to a precharging/equalizing signal PR/EQ which is supplied to a gate electrode of an equalizing transistor Qe1. Similarly to the above, precharging transistors Qp2 and /Qp2 to Qp4 and /Qp4 are connected also between other bit line pairs MBL2 and /MBL2 to MBL4 and /MBL4 respectively.

According to the embodiment 2, therefore, a precharging potential Vpc is directly supplied to all main bit line pairs MBL1 and /MBL1 to MBL4 and /MBL4 in response to the precharging/equalizing signal PR/EQ of a high level, whereby the main bit line pairs MBL2 and /MBL1 to MBL4 and /MBL4 are precharged at a higher speed than that in the embodiment 1.

Embodiment 3

Figure 6:
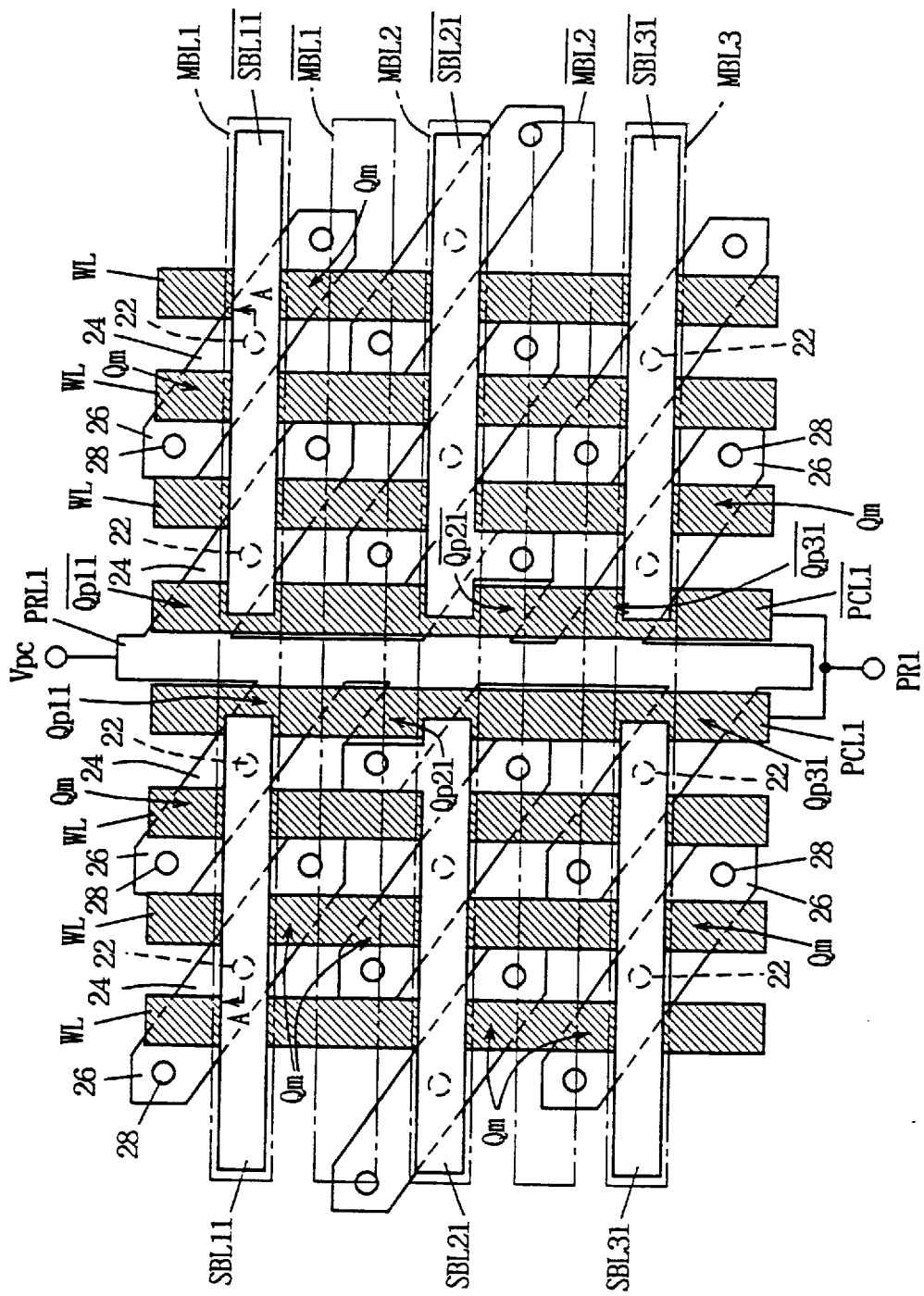
FIG. 6 is a plan view showing a partial structure of a memory cell array in a DRAM according to an embodiment 3 of the present invention.
Figure 7:
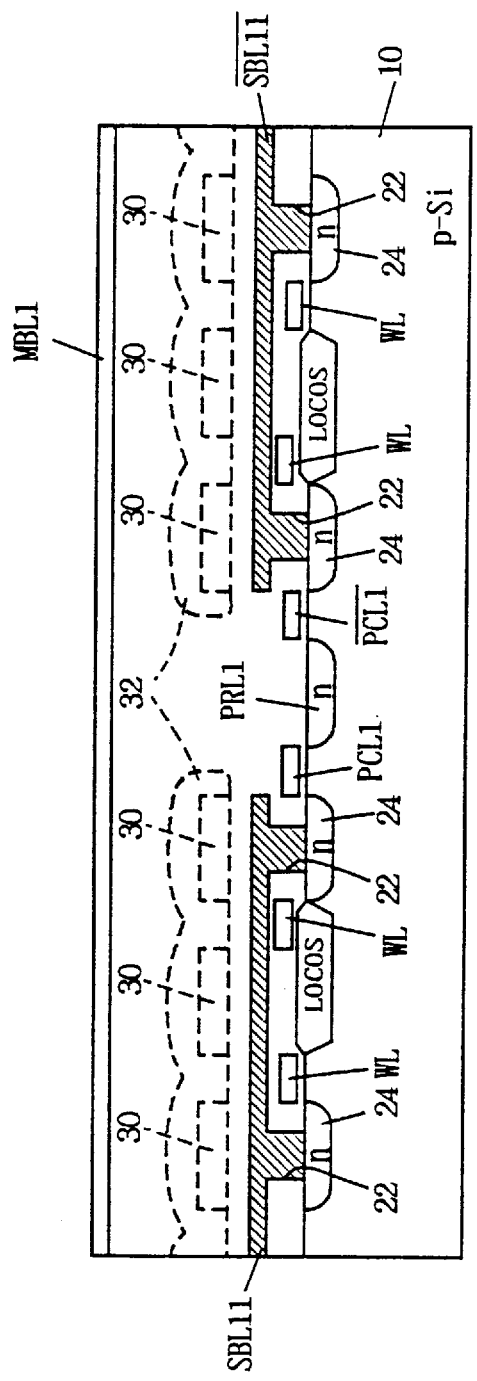
FIG. 7 is a sectional view taken along the line A—A in FIG. 6.

FIG. 6 is a plan view showing a partial structure of a memory cell array provided in a DRAM according to an embodiment 3 of the present invention. FIG. 7 is a sectional view taken along the line A—A in FIG. 6, and FIG. 8 is a wiring diagram corresponding to FIG. 6.

Figure 8:
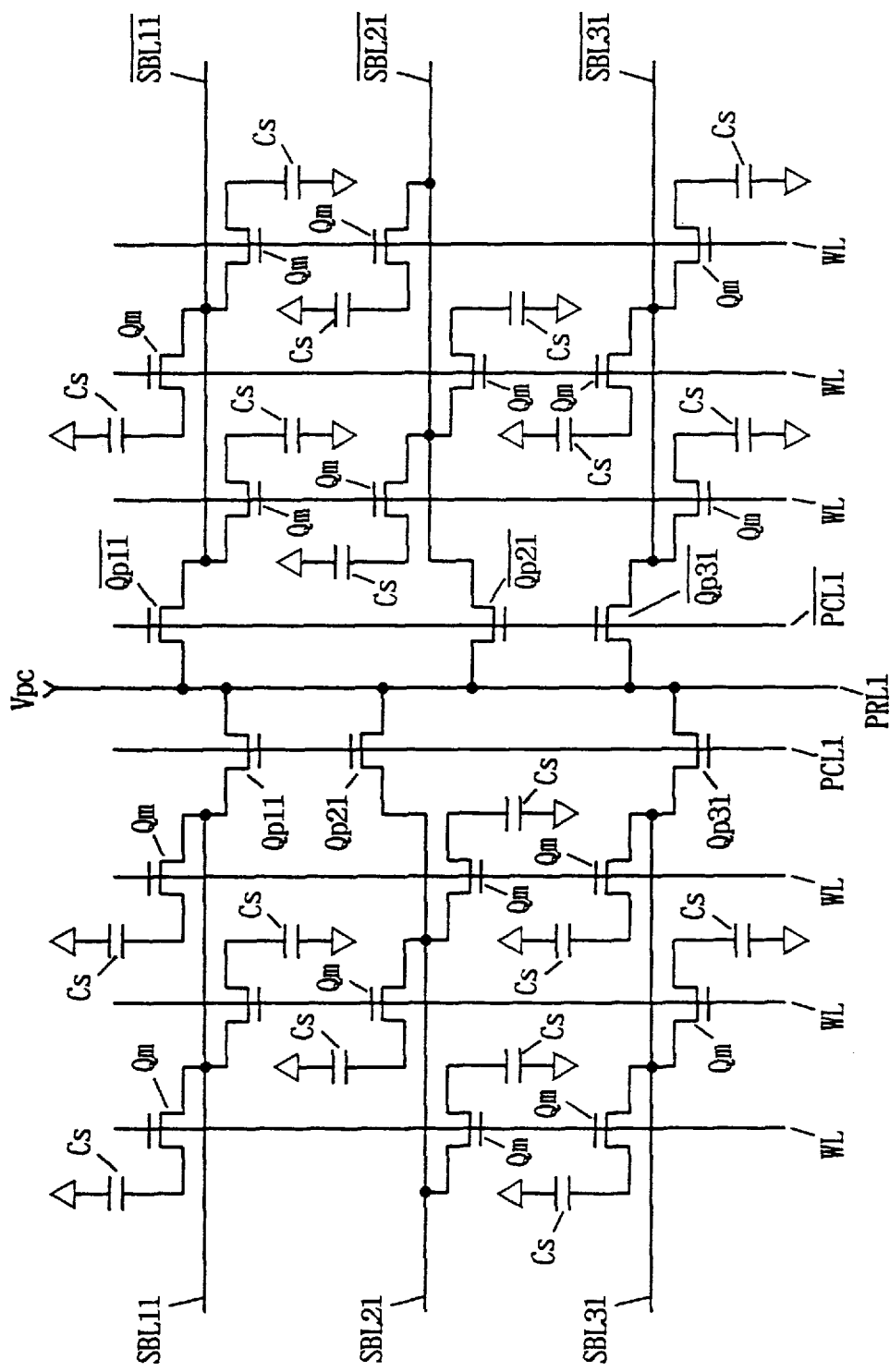
FIG. 8 is a wiring diagram corresponding to the memory cell array shown in FIG. 6.

Referring to FIGS. 6 to 8, pseudo word lines which are arranged for maintaining periodicity of word lines WL are utilized as precharging control lines PCL1 and /PCL1. Namely, the precharging control lines PCL1 and /PCL1 are formed similarly to the word lines WL.

Subbit lines SBL11 to SBL31 and /SBL11 to /SBL31 are connected to first source/drain regions 24 of access transistors Qm through contact holes 22 respectively. Second source/drain regions 26 of the access transistors Qm are connected to storage nodes 30 through contact holes 28 respectively. The source/drain regions 24 and 26 are formed by n-type diffusion regions which are formed in a p-type silicon substrate 10. Cell plate electrodes 32 are formed on the storage nodes 30 through insulating films (not shown). Cell capacitors Cs are formed by the storage nodes 30 and the cell plate electrodes 32.

First source/drain regions of precharging transistors Qp11 to Qp31 and /Qp11 to /Qp31 are formed by a single n-type diffusion region which is formed on the silicon substrate 10. A precharging potential Vpc is supplied to such a common diffusion region. Therefore, this n-type diffusion region forms a precharging potential supply line PRL1. On the other hand, second source/drain regions of the precharging transistors Qp11 to Qp31 and /Qp11 to /Qp31 are rendered in common with the first source/drain regions 24 of the adjacent access transistors Qm. When a high-level precharging signal PR1 is supplied to precharging control lines PCL1 and /PCL1, therefore, all precharging transistors Qp11 to Qp31 and /Qp11 to /Qp31 enter conducting states, whereby the precharging potential Vpc on the diffusion region forming the precharging potential supply line PRL1 is supplied to all subbit lines SBL11 to SBL31 and /SBL11 to /SBL31.

According to the embodiment 3, the pseudo word lines which are arranged for maintaining periodicity of the word lines are utilized as precharging control lines PCL1 and /PCL1 while the diffusion region between the precharging control lines PCL1 and /PCL1 is utilized as the precharging potential supply line PRL1, whereby the chip area is not increased by provision of the precharging transistors.

Embodiment 4

Figure 9:
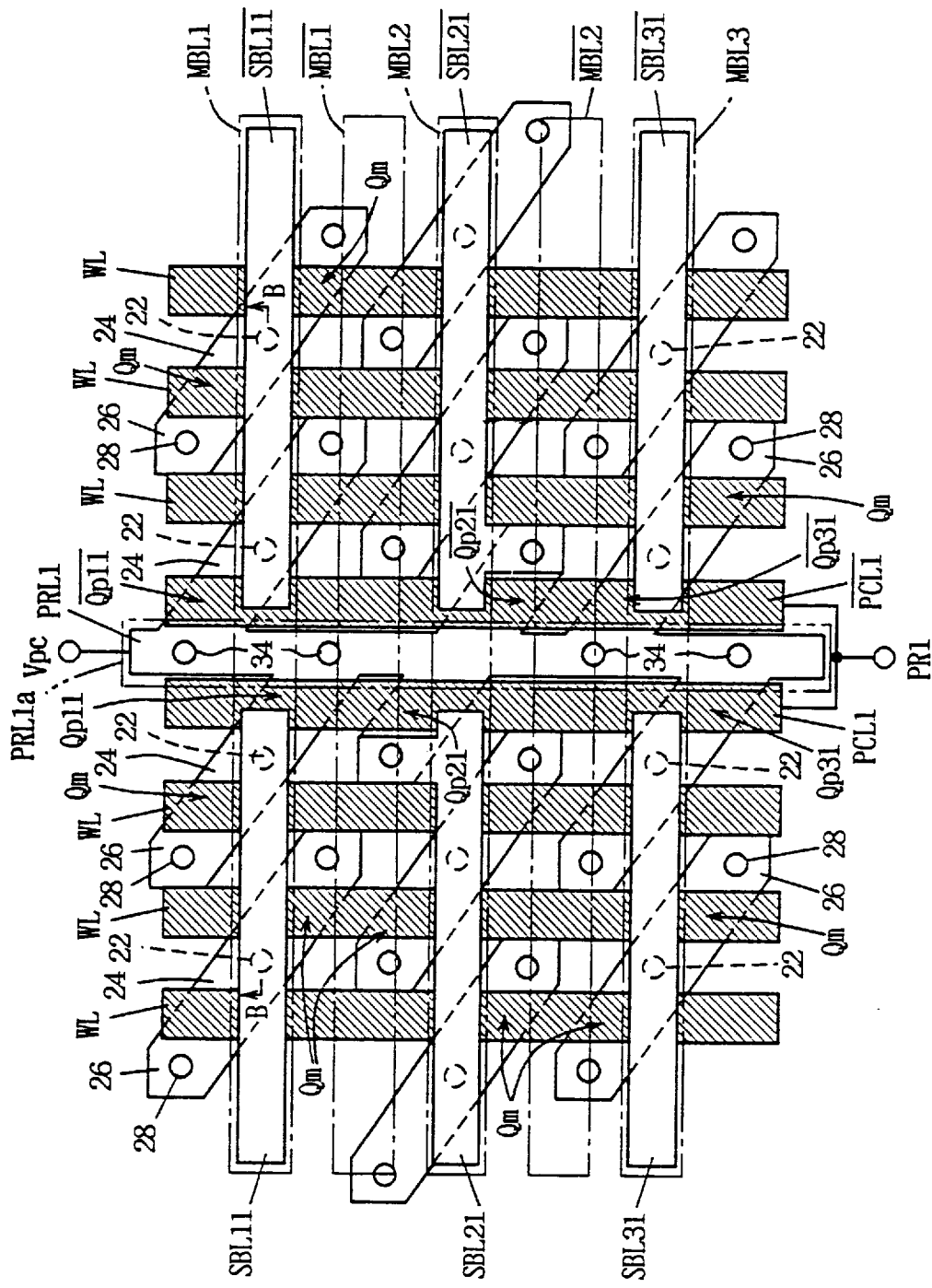
FIG. 9 is a plan view showing a partial structure of a memory cell array in a DRAM according to an embodiment 4 of the present invention.
Figure 10:
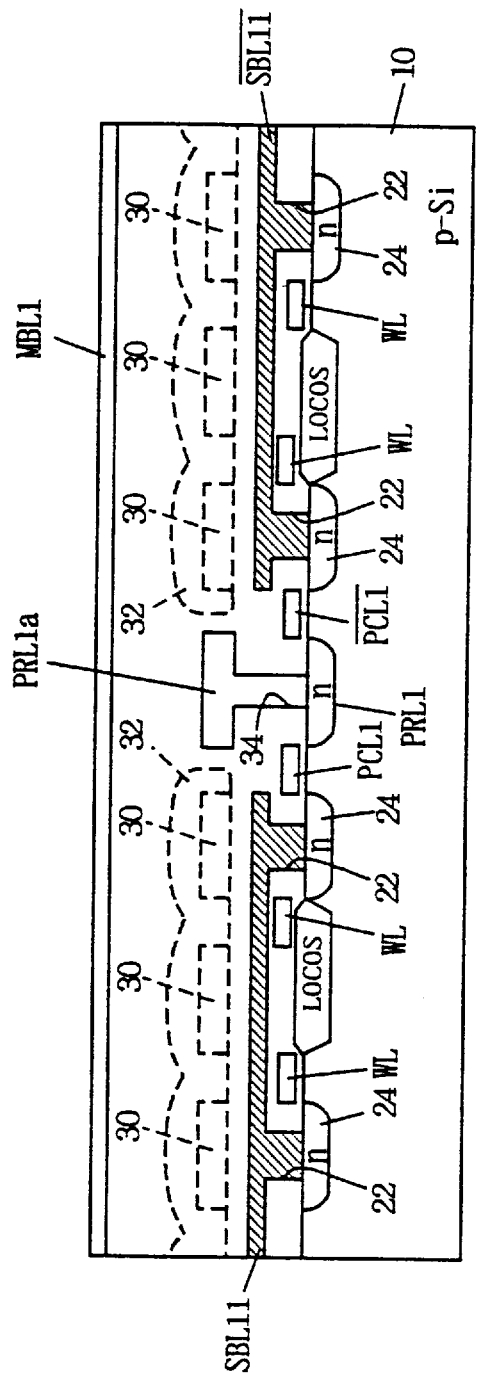
FIG. 10 is a sectional view taken along the line B—B in FIG. 9.

FIG. 9 is a plan view showing a partial structure of a memory cell array provided in a DRAM according to an embodiment 4 of the present invention. FIG. 10 is a sectional view taken along the line B—B in FIG. 9.

Referring to FIGS. 9 and 10, an additional precharging potential supply line PRL1a which is made of polysilicon or the like is formed on a precharging potential supply line PRL1 consisting of a diffusion region, dissimilarly to the structure shown in FIG. 6. The precharging potential supply line PRL1a is formed in the same layer as storage nodes 30, and connected to the precharging potential supply line PRL1 through contact holes 34 which are formed at prescribed intervals.

Figure 11:
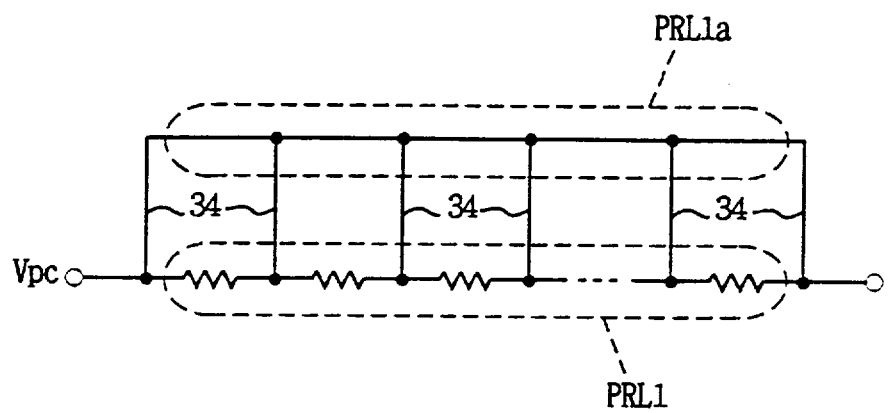
FIG. 11 is an equivalent circuit diagram showing two precharging potential supply lines shown in FIGS. 9 and 10.

FIG. 11 illustrates an equivalent circuit of the precharging potential supply lines PRL1 and PRL1a. As shown in FIG. 11, the precharging potential supply line PRL1 which is formed by a diffusion region has a high resistance value. If no precharging potential supply line PRL1a is provided, therefore, a precharging potential Vpc cannot be uniformly supplied to all subbit line pairs SBL11 and /SBL11 to SBL31 and /SBL31, due to a voltage drop of this resistance. According to the embodiment 4, however, the precharging potential supply line PRL1a is formed in parallel with the precharging potential supply line PRL1 while the former is connected to the latter through the contact holes 34 which are formed at prescribed intervals, whereby the precharging potential Vpc is uniformly supplied to all subbit line pairs SBL11 and /SBL11 to SBL31 and /SBL31.

According to the embodiment 4, as hereinabove described, the precharging potential supply line PRL1 consisting of a diffusion region is piled with the precharging potential supply line PRL1a, whereby all subbit line pairs SBL11 and /SBL11 to SBL31 and /SBL31 are reliably precharged to the prescribed precharging potential Vpc at a high speed. Thus, the data read speed is further increased.

Embodiment 5

Figure 12:
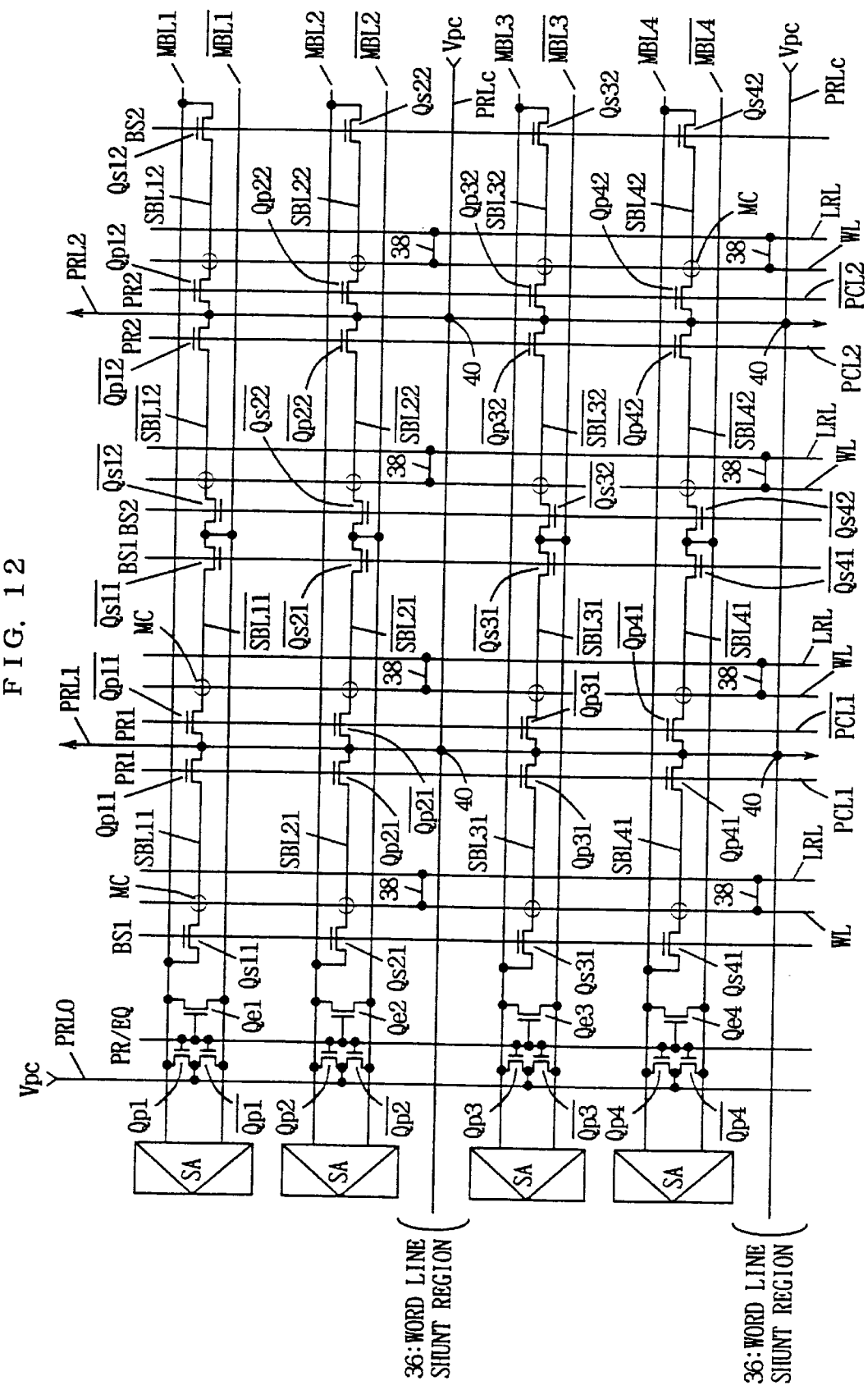
FIG. 12 is a circuit diagram showing a partial structure of a memory cell array in a DRAM according to an embodiment 5 of the present invention.
Figure 13:
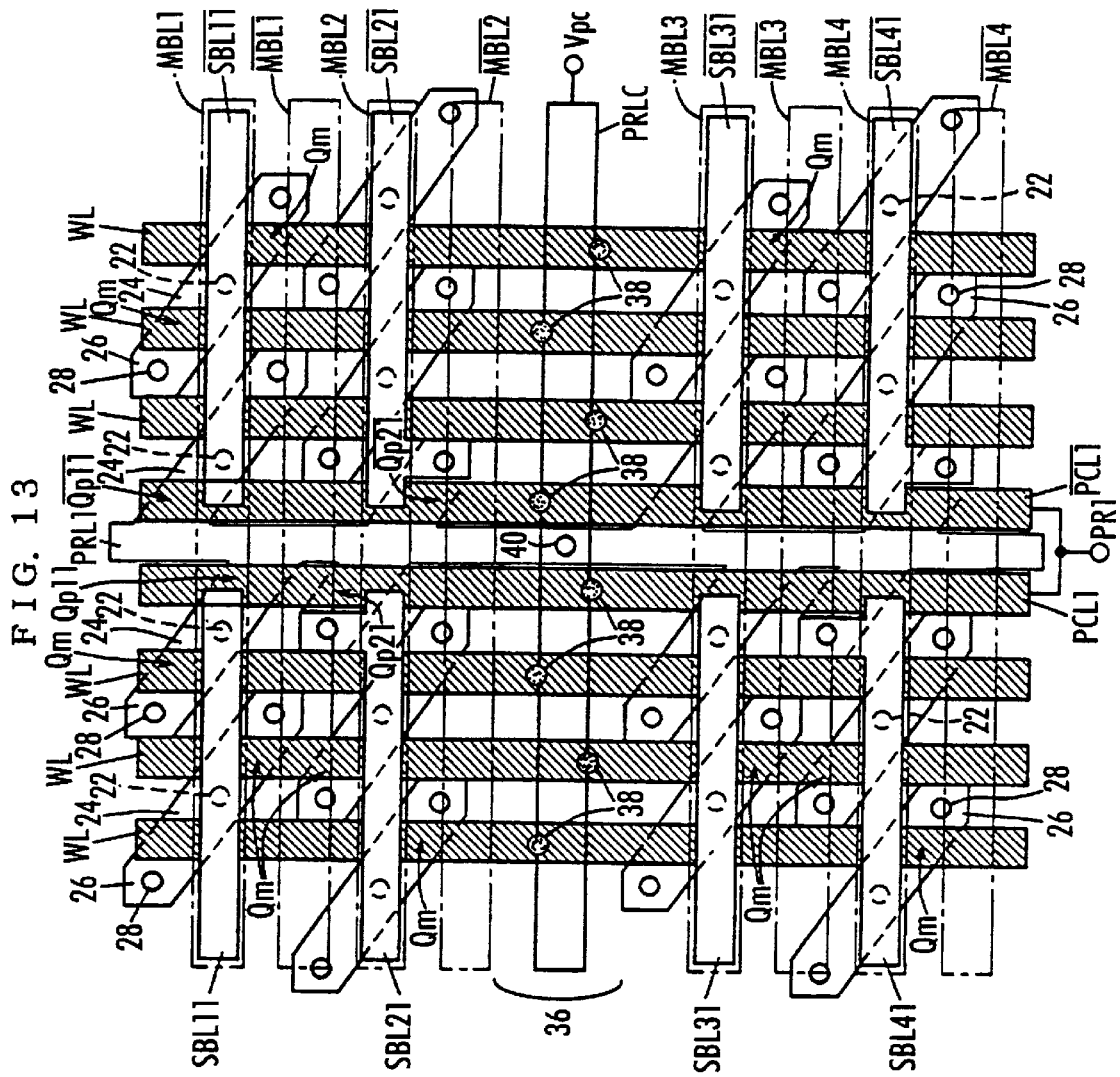
FIG. 13 is a plan view showing a part of the memory cell array shown in FIG. 12.

FIG. 12 is a circuit diagram showing a partial structure of a memory cell array provided in a DRAM according to an embodiment 5 of the present invention. FIG. 13 is a plan view corresponding to a part of FIG. 12.

Referring to FIGS. 12 and 13, word line shunt regions 36 are provided every two columns in the embodiment 5, dissimilarly to the structure shown in FIG. 5. A single low resistance line LRL is arranged in parallel with each of word lines WL, and the word lines WL are connected with the corresponding low resistance lines LRL through contact holes 38 which are formed in the word line shunt regions 36. FIG. 12 representatively shows only four low resistance lines LRL. When the word lines WL are long, the same are piled with the low resistance lines LRL in general.

Further, single precharging potential supply lines PRLc are arranged on the respective word line shunt regions 36, and connected with all intersecting precharging potential supply lines PRL1 and PRL2 through contact holes 40. Therefore, a precharging potential Vpc is supplied from the plurality of precharging potential supply lines PRLc which are arranged to intersect with the word lines WL to a plurality of subbit lines SBL11 and /SBL11 to SBL 41 and /SBL41 and SBL12 and /SBL12 to SBL42 and /SBL42 through the plurality of precharging potential supply lines PRL1 and PRL2 which are arranged along the word lines WL respectively.

According to the embodiment 5, as hereinabove described, the precharging potential Vpc, which is supplied from the plurality of precharging potential supply lines PRLc which are arranged at prescribed intervals to the precharging potential supply lines PRL1 and PRL2, is reliably supplied to the subbit line pairs SBL11 and /SBL11 to SBL41 and /SBL41 and SBL12 and /SBL12 to SBL42 and /SBL42 also when the precharging potential supply line PRL1 is long. Thus, the data read speed is further increased. In addition, the precharging potential supply lines PRLc are arranged in the word line shunt regions 36, whereby the chip area is not increased by addition of the precharging potential supply lines PRLc.

Embodiment 6

Figure 14:
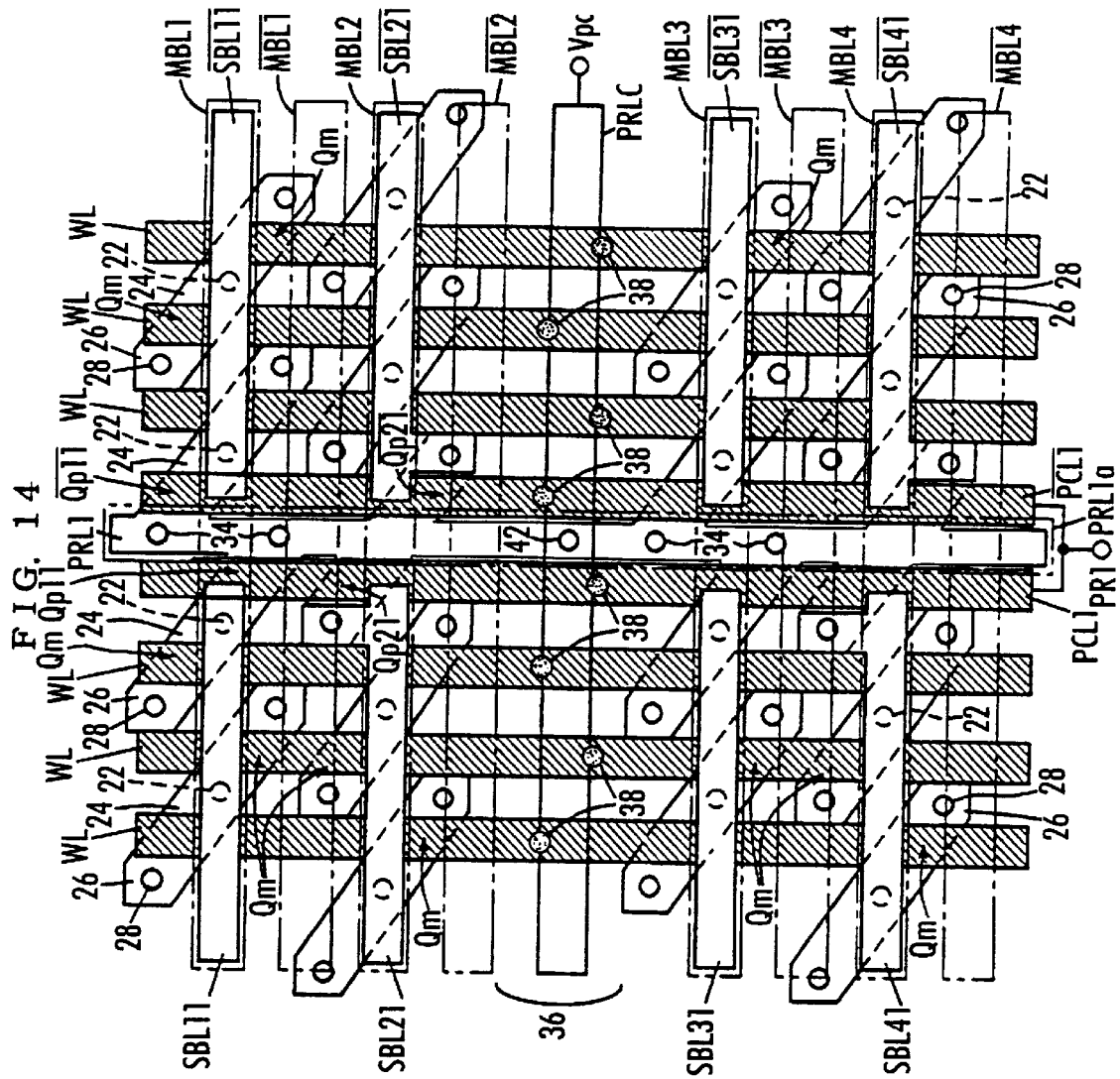
FIG. 14 is a plan view showing a partial structure of a memory cell array in a DRAM according to an embodiment 6 of the present invention.

FIG. 14 is a plan view showing a partial structure of a memory cell provided in a DRAM according to an embodiment 6 of the present invention. Referring to FIG. 14, a precharging potential supply line PRL1a of the same layer as storage nodes are formed on a precharging potential supply line PRL1 which is formed by a diffusion region, similarly to the embodiment 4. Further, single precharging potential supply lines PRLc are arranged in respective word line shunt regions 36, similarly to the embodiment 5. All precharging potential supply lines PRLc are connected to the intersecting precharging potential supply line PRL1a through contact holes 42. Therefore, a precharging potential Vpc is supplied from the precharging potential supply lines PRLc to subbit line pairs through the precharging potential supply lines PRL1a and PRL1.

According to the embodiment 6, the precharging potential Vpc is supplied from the precharging potential supply lines PRLc to the subbit line pairs through the precharging potential supply lines PRL1a and PRL1 while the precharging potential supply line PRL1 which is formed by a diffusion region is piled with the precharging potential supply line PRL1a, whereby all subbit line pairs are reliably precharged to the prescribed precharging potential Vpc at a high speed. Further, the contact holes 42 for connecting the precharging potential supply lines PRLc to the precharging potential supply line PRL1a may be formed, whereby the manufacturing process is simplified as compared with the case of forming the contact holes 40 for connecting the precharging supply lines PRLc to the precharging potential supply line PRL1 in the aforementioned embodiment 5.

Embodiment 7

Figure 15:
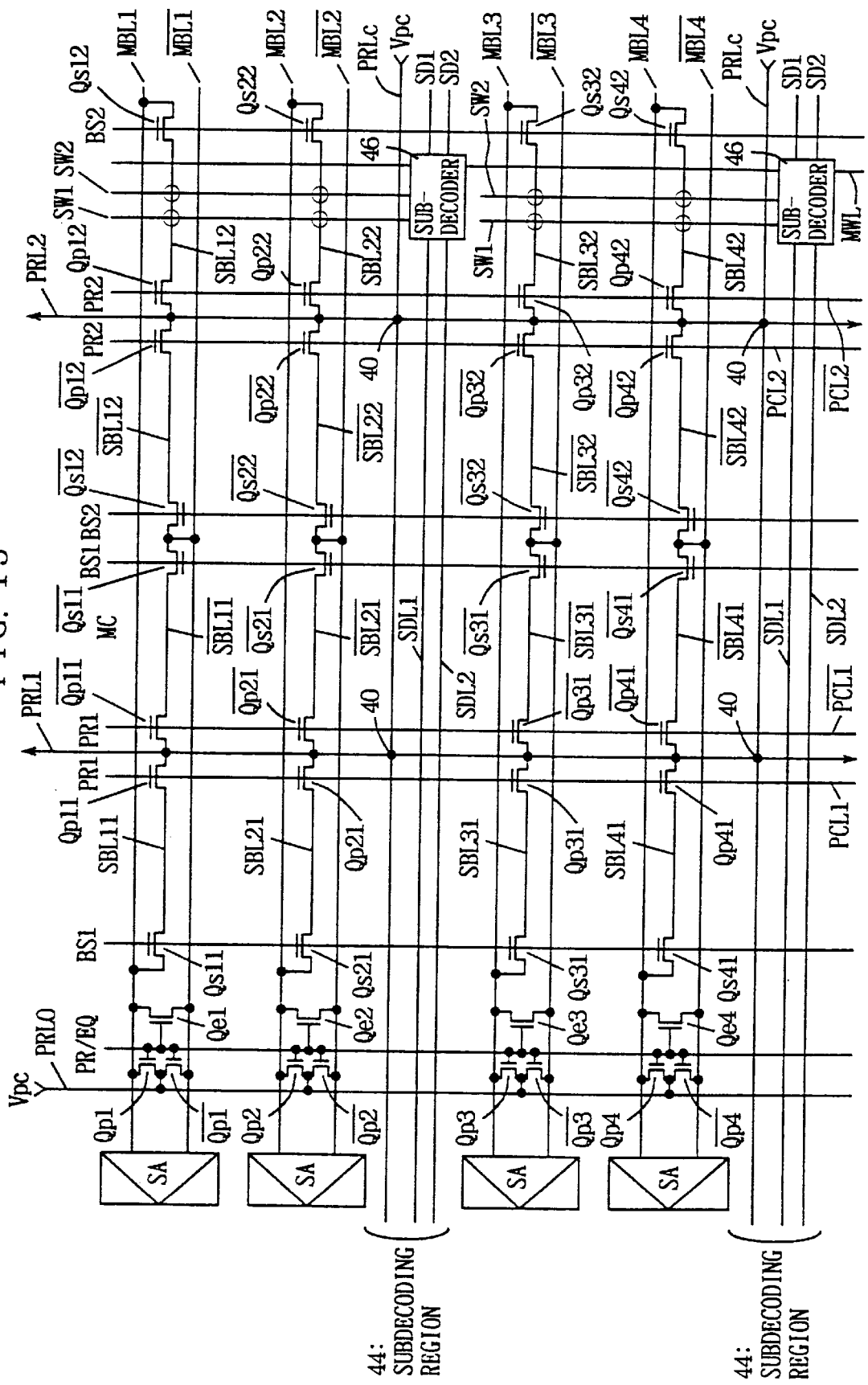
FIG. 15 is a circuit diagram showing a partial structure of a memory cell array in a DRAM according to an embodiment 7 of the present invention.

FIG. 15 is a circuit diagram showing a partial structure of a memory cell array provided in a DRAM according to an embodiment 7 of the present invention. According to this embodiment 7, the present invention is applied to a divided word line structure of two ways. Referring to FIG. 15, precharging potential supply lines PRLc are arranged in subdecoding regions 44 in the embodiment 7, in place of the word line shunt regions 36 of the aforementioned embodiment 5.

The memory cell array according to the embodiment 7 is divided every two columns, and the subdecoding regions 44 are provided every two columns. Word lines are divided every two columns, and not arranged longitudinally across all columns. Namely, an even number of subword lines are arranged to intersect with two subbit lines SBL11 and SBL21. Similarly to this, even numbers of subword lines are arranged to intersect with pairs of subbit lines /SBL11 and /SBL21, /SBL12 and /SBL22, SBL12 and SBL22, SBL31 and SBL41, /SBL31 and /SBL41, /SLB32 and /SBL42, and SBL32 and SBL42 respectively. FIG. 15 representatively shows only two subword lines SWL1 and SWL2 intersecting with the subbit lines SBL12 and SBL22. Further, main word lines MWL of a number half that of the subword lines are arranged along the subword lines. FIG. 15 representatively shows only a single main word line MBL. Referring to FIG. 15, therefore, four subword lines SWL1 and SWL2 are arranged in correspondence to one main word line MWL.

Further, two subdecoding lines SDL1 and SDL2 are arranged in each subdecoding region 44. In addition, one subdecoder 46 is arranged in correspondence to two subword lines. FIG. 15 representatively shows only two subdecoders 46. Each subdecoder 46 activates one of two subword lines SWL1 and SWL2 in response to subdecoding signals SD1 and SD2 on subdecoding lines SDL1 and SDL2.

Figure 16:
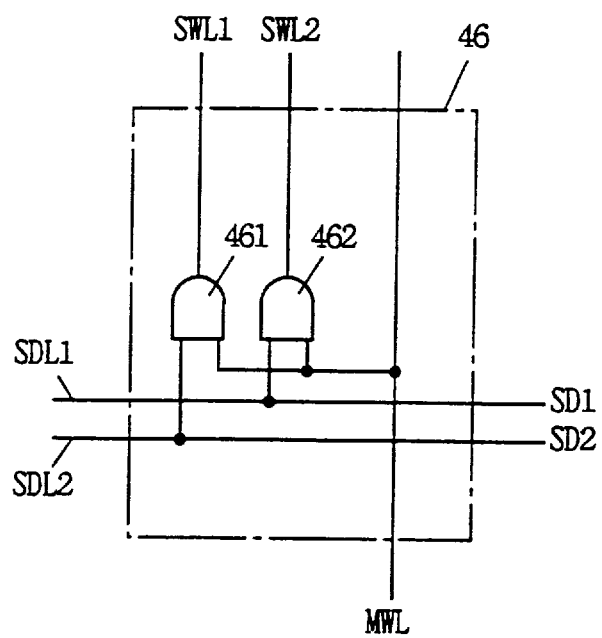
FIG. 16 is a circuit diagram showing a concrete structure of one subdecoder shown in FIG. 15.

FIG. 16 is a circuit diagram showing a concrete structure of each subdecoder 46. Referring to FIG. 16, the subdecoder 46 comprises an AND gate 461 having two input nodes which are connected to the main word line MWL and the subdecoding line SDL1 respectively, and another AND gate 462 having two input nodes which are connected to the main word line MWL and the subdecoding line SDL2. Output nodes of the AND gates 461 and 462 are connected to the subword lines SWL1 and SWL2 respectively.

When the potential of the main word line MWL and the subdecoding signal SD1 rise, therefore, potentials of all subword lines SWL1 which are arranged on the corresponding row rise. When the potential of the main word line MWL and the subdecoding signal SD2 rise, on the other hand, potentials of all subword lines SWL2 which are arranged on the corresponding row rise.

According to the embodiment 7, the precharging potential supply lines PRLc are arranged in the subdecoding regions 44 for arranging the subdecoding lines SDL1 and SDL2, whereby the chip area is not increased due to addition of the precharging potential supply lines PRLc. Further, the precharging potential Vpc is supplied from the precharging potential supply lines PRLc to all subbit line pairs through the precharging potential supply lines PRL1 and PRL2, whereby the subbit line pairs are reliably precharged to the prescribed precharging potential Vpc at a high speed. Thus, the data read speed is further increased.

Other Embodiments

While the embodiments of the present invention have been described, the scope of the present invention is not restricted by the aforementioned embodiments. While only two precharging transistors are connected between each pair of subbit lines in each of the aforementioned embodiments, for example, an equalizing transistor may be connected between each pair of subbit lines in addition. While the subbit line pairs are in the so-called open bit line structure in the aforementioned embodiments, the same may alternatively be in the so-called folded bit line structure. Further, the numbers of the main bit line pairs, the subbit line pairs, the precharging transistors etc. are not particularly restricted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a semiconductor substrate;

a plurality of memory cell blocks arranged on said semiconductor substrate in a row direction;

a plurality of main bit line pairs arranged on said semiconductor substrate across said plurality of memory blocks; and precharging potential generation means generating a prescribed precharging potential, wherein each of said plurality of memory cell blocks includes a plurality of subbit line pairs corresponding to said plurality of main bit line pairs, the subbit lines of each subbit line pair arranged structurally along a single straight line extending in a direction parallel to the corresponding main bit line pair, wherein each of said plurality of memory cell blocks further includes a plurality of selection transistor pairs, corresponding to said plurality of subbit line pairs and being turned on in response to a prescribed block selection signal, each selection transistor pair connected between the corresponding main bit line pair and the corresponding subbit line pair, a plurality of word lines each intersecting one subbit line of each said plurality of subbit line pairs, a plurality of memory cells corresponding to intersection points between said word lines and said subbit lines, each memory cell being connected to the corresponding subbit line and the corresponding word line, a first precharging potential supply line extending in a direction parallel to said word lines and between the subbit lines of the subbit line pairs and supplied with said precharging potential from said precharging potential generation means, a first precharging control line extending in a direction parallel to said word lines and between said first precharging potential supply line and a first plurality of said word lines, a second precharging control line extending in a direction parallel to said word lines and between said first precharging potential supply line and a second plurality of said word lines, a plurality of first precharging transistors, corresponding to one subbit line of each of said plurality of subbit line pairs and connected between the corresponding one subbit line and said first precharging potential supply line and having a control electrode being connected to said first precharging control line, and a plurality of second precharging transistors, corresponding to the other subbit line of each of said plurality of subbit line pairs and connected between the corresponding other subbit line and said first precharging potential supply line and having a control electrode being connected to said second precharging control line.

2. The semiconductor memory device in accordance with claim 1, further comprising:

a plurality of second precharging potential supply lines being arranged on said semiconductor substrate to intersect with a plurality of said first precharging potential supply lines in said plurality of memory cell blocks and connected with said plurality of first precharging potential supply lines, wherein said precharging potential from said precharging potential generation means is supplied to said plurality of first precharging potential supply lines through said plurality of second precharging potential supply lines.

3. The semiconductor memory device in accordance with claim 1, wherein each of said plurality of memory cells includes:

an access transistor having a gate electrode consisting of the corresponding word line, one source/drain region being connected to the corresponding subbit line and formed on said semiconductor substrate, and other source/drain region being formed on said semiconductor substrate, and a cell capacitor having a storage node electrode being connected to said other source/drain region of said access transistor, each of said plurality of first precharging transistors has a gate electrode consisting of said first precharging control line, one source/drain region being connected to the corresponding one subbit line and formed on said semiconductor substrate, and other source/drain region being connected to said first precharging potential supply line and formed on said semiconductor substrate, each of said plurality of second precharging transistors has a gate electrode consisting of said second precharging control line, one source/drain region being connected to the corresponding other subbit line and formed on said semiconductor substrate, and other source/drain region being connected to said first precharging potential supply line and formed on said semiconductor substrate.

4. The semiconductor memory device in accordance with claim 3, wherein said first precharging potential supply means includes one diffusion region rendering said other source/drain regions of said plurality of first and second precharging transistors in common.

5. The semiconductor memory device in accordance with claim 4, wherein each of said plurality of memory cell blocks includes:

a third precharging potential supply line being formed on said diffusion region forming said first precharging potential supply line via an insulating film and being connected with said diffusion region through a plurality of contact holes being formed in said insulating film at prescribed intervals.

6. The semiconductor memory device in accordance with claim 5, further comprising:

a plurality of fourth precharging potential supply lines being arranged on said semiconductor substrate to intersect with said plurality of third precharging potential supply lines in said plurality of memory cell blocks and connected with said plurality of third precharging potential supply lines, wherein said precharging potential from said precharging potential generation means is supplied to said plurality of third precharging potential supply lines through said plurality of fourth precharging potential supply lines.

* * * * *